(12) United States Patent
Taira et al.

(10) Patent No.: US 9,117,953 B2
(45) Date of Patent: Aug. 25, 2015

(54) SOLAR CELL MODULE AND SOLAR CELL

(71) Applicant: Sanyo Electric Co., Ltd., Moriguchi, Osaka (JP)

(72) Inventors: Shigeharu Taira, Amagasaki (JP); Satoshi Tohoda, Kobe (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/682,871

(22) Filed: Nov. 21, 2012

(65) Prior Publication Data

US 2013/0074902 A1    Mar. 28, 2013

Related U.S. Application Data

(63) Continuation of application No. PCT/JP2011/061423, filed on May 18, 2011.

(30) Foreign Application Priority Data

May 25, 2010    (JP) .................................. 2010-119128

(51) Int. Cl.
*H01L 31/05* (2014.01)
*H01L 31/0224* (2006.01)

(52) U.S. Cl.
CPC .... *H01L 31/0508* (2013.01); *H01L 31/022433* (2013.01); *H01L 31/0504* (2013.01); *H01L 31/0512* (2013.01); *Y02E 10/50* (2013.01)

(58) Field of Classification Search
CPC ................ H01L 31/00; H01L 31/0201; H01L 31/02008; H01L 31/0224; H01L 31/022433; H01L 31/022425; H01L 31/04; H01L 31/042; H01L 31/0465; H01L 31/05

USPC ......................................................... 136/256
See application file for complete search history.

(56) References Cited

U.S. PATENT DOCUMENTS

| 2007/0235077 A1* | 10/2007 | Nagata et al. .................. 136/256 |
| 2009/0126788 A1* | 5/2009 | Hishida et al. ................ 136/256 |
| 2011/0011454 A1 | 1/2011 | Taira |
| 2012/0031457 A1 | 2/2012 | Taira et al. |

FOREIGN PATENT DOCUMENTS

| DE | 102007062689 A1 | 7/2008 | |
| EP | 2219226 A2 * | 8/2010 | .......... H01L 31/0224 |
| JP | 9-116175 A | 5/1997 | |
| JP | 2004-14566 A | 1/2004 | |
| JP | 2006-156693 A | 6/2006 | |
| JP | 2008-159895 A | 7/2008 | |

(Continued)

*Primary Examiner* — Christina Chern
(74) *Attorney, Agent, or Firm* — Marvin A. Motsenbocker; Mots Law, PLLC

(57) ABSTRACT

Disclosed is a solar cell module that includes: a plurality of solar cells; wiring material electrically connecting solar cells with each other; and resin adhesive that bonds solar cells and wiring material together. Solar cells each include photoelectric conversion body and electrode. Electrode includes finger electrode. Finger electrode extends in direction y orthogonal to direction x in which wiring material extends. In bonding area of finger electrode bonded to wiring material, an end portion on one side in direction y in which finger electrode extends is bonded to wiring material with lower bonding strength than at least part of the other portion of bonding area.

7 Claims, 6 Drawing Sheets

(56) References Cited

FOREIGN PATENT DOCUMENTS

| JP | 2009-295940 A | 12/2009 |
| JP | 2010-10245 A | 1/2010 |
| JP | 2010-56229 A | 3/2010 |
| WO | 2009099179 A1 | 8/2009 |
| WO | 2010-095583 A1 | 8/2010 |

* cited by examiner

SOLAR CELL MODULE AND SOLAR CELL

CROSS REFERENCE TO RELATED APPLICATIONS

This application is a continuation application of International Application No. PCT/JP2011/061423, filed on May 18, 2011, entitled "SOLAR CELL MODULE AND SOLAR CELL", which claims priority based on Article 8 of Patent Cooperation Treaty from prior Japanese Patent Applications No. 2010-119128, filed on May 25, 2010, the entire contents of which are incorporated herein by reference.

BACKGROUND OF THE INVENTION

1. Field of the Invention

The invention relates to a solar cell module and a solar cell.

2. Description of Related Art

Recently, a solar cell module has been receiving much attention as an energy source imposing a small environmental load.

Generally, a solar cell module includes a plurality of solar cells. The plurality of solar cells are electrically connected with each other in series or in parallel through a wiring material.

Conventionally, solder has been widely used for bonding the solar cell module and the wiring material together. However, the bonding of the solar cell module and the wiring material to each other using the solder requires the solder to be melted. Thus, in the bonding step, the temperature of the solar cell becomes high. As a result, the solar cell might be damaged or deformed.

In view of this situation, the use of a conductive resin adhesive for bonding the solar cell module and the wiring material together has been recently proposed (see, for example Patent Document 1).

When the solar cell and the wiring material are bonded together using a resin adhesive such as a conductive resin adhesive, the temperature during the bonding step can be made low unlike in the case where the solder is used for the adhesion. Thus, the solar cell can be prevented from being damaged, deformed, or the like in the step of bonding the wiring material.

PRIOR ART DOCUMENT

PATENT DOCUMENT 1: Japanese Patent Application Publication No. 2009-295940

SUMMARY OF THE INVENTION

As an embodiment of the invention, provided is a solar cell module that includes: a plurality of solar cells; a wiring material; and a resin adhesive. The solar cells each include a photoelectric conversion body and an electrode. The electrode is provided on a surface of the photoelectric conversion body. The wiring material electrically connects the plurality of solar cells with each other. The resin adhesive bonds the solar cells and the wiring material together. The electrode includes a finger electrode. The finger electrode extends in a direction orthogonal to a direction in which the wiring material extends. In a bonding area of the finger electrode bonded to the wiring material, an end portion on one side in the direction in which the finger electrode extends is bonded to the wiring material with lower bonding strength than at least part of the other portion of the bonding area.

In the bonding area, the end portion on one side in the direction in which the finger electrode extends may be in direct contact with the wiring material.

The at least part of the other portion of the bonding area may be bonded to the wiring material by the resin adhesive.

In the bonding area, an end portion on the other side in the direction in which the finger electrode extends may be bonded to the wiring material by the resin adhesive.

A thickness of the bonding area of the finger electrode may decrease from the one side to the other side in the direction in which the finger electrode extends.

A width of the bonding area of the finger electrode may decrease from the one side to the other side in the direction in which the finger electrode extends.

A plurality of the finger electrodes may be provided, and in at least one of the finger electrodes, an end portion of the bonding area on one side in the direction in which the finger electrode extends may be bonded to the wiring material with lower bonding strength than at least part of the other portion of the bonding area.

As another embodiment of the invention, provided is solar cell that includes: a photoelectric conversion body; and an electrode provided on a surface of the photoelectric conversion body and being a portion to which a wiring material is to be connected. The electrode includes a finger electrode extending in one direction, the finger electrode includes a portion of which a thickness decreases from one side to the other side in the one direction, and the portion of the finger electrode is a portion to be connected to the wiring material.

A width of the portion of the finger electrode may decrease from the one side to the other side.

As still another embodiment of the invention, provided is a solar cell that includes: a photoelectric conversion body; a plurality of finger electrodes provided on a surface of the photoelectric conversion body; a bas bar electrode that intersects at least one finger electrode at an angle on a surface of the photoelectric conversion body, wherein the angle is not perpendicular to a longitudinal direction of the plurality of the finger electrode; wherein at least one finger electrode comprises: an edge portion farthest from the bus bar electrode; and an intersection portion that the finger electrode intersects the bus bar electrode, wherein a width of the intersection portion is larger than that of the edge portion.

The intersection portion may have the largest portion in thickness in the finger electrode.

DETAILED DESCRIPTION OF EMBODIMENTS

Figure 1:
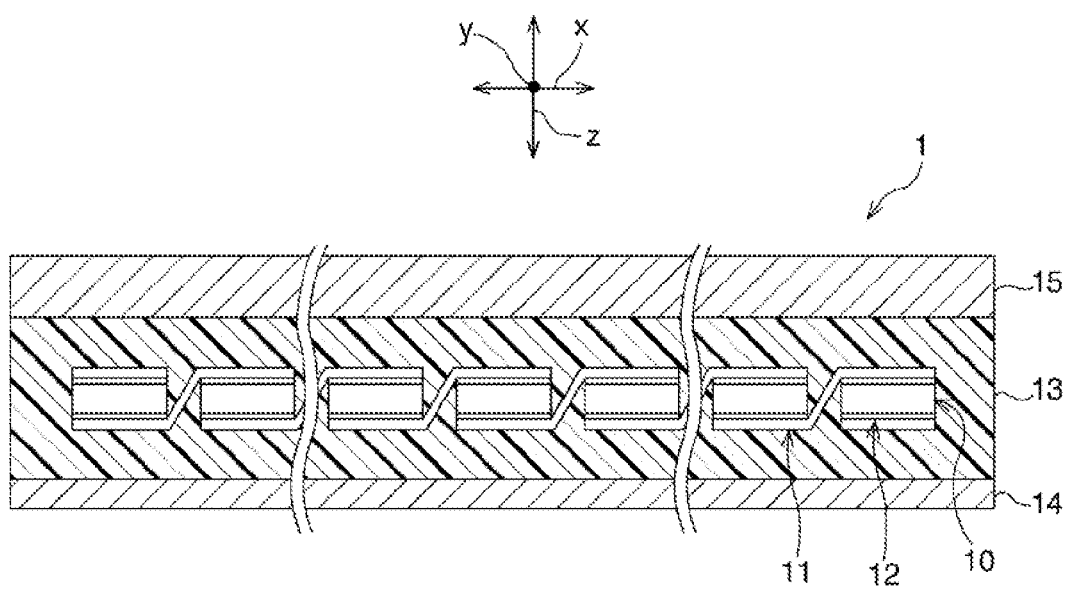
FIG. 1 is a schematic cross-sectional view of a solar cell module according to a first embodiment.

Embodiments of the invention are described with solar cell module 1 shown in FIG. 1 as an example. It is to be noted that solar cell module 1 is merely an example, and the solar cell module according to the invention is not particularly limited to solar cell module 1.

In the drawings referred to in embodiments and modifications, the same reference sign denote materials having substantially the same function. In addition, it should be noted that the drawings referred to in embodiments and the like are schematic and ratios of dimensions and the like of an object in the drawings might be different from actual ones. Moreover, the drawings also include objects having different ratios of dimensions. Therefore, specific ratios of dimensions and the like should be determined in consideration of the following description.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

(Overall Configuration of Solar Cell Module 1)

FIG. 1 is a schematic cross-sectional view of a solar cell module according to an embodiment. First of all, overall configuration of solar cell module 1 is described with reference to FIG. 1.

As shown in FIG. 1, solar cell module 1 includes a plurality of solar cells 10 arranged along arrangement direction x. Solar cells 10 are electrically connected with each other through wiring materials 11. Specifically, solar cells 10 are electrically connected in series or in parallel with adjacent solar cells 10 being electrically connected with each other through wiring material 11.

First and second protecting materials 14 and 15 are respectively disposed on light-receiving surface and back surface sides of solar cells 10. Sealing material 13 is disposed between first protecting material 14 and second protecting material 15. Solar cells 10 are sealed by sealing material 13.

Materials of sealing material 13 as well as first and second protecting materials 14 and 15 are not particularly limited. For example, sealing material 13 may be made of a translucent resin such as ethylene-vinyl acetate (EVA) copolymer and polyvinyl butyral (PVB).

For example, first and second protecting materials 14 and 15 may be made of glass, resin, or the like. Alternatively, for example, one of first and second protecting materials 14 and 15 may be made of a resin film in which a metal foil such as an aluminum foil is interposed. In this embodiment, first protecting material 14 is disposed on the back surface side of solar cell 10 and is made of the resin film in which a metal foil such as an aluminum foil is interposed. Second protecting material 15 is disposed on the light-receiving surface side of solar cell 10 and is made of glass or a translucent resin.

(Configuration of Solar Cell 10)

Figure 2:
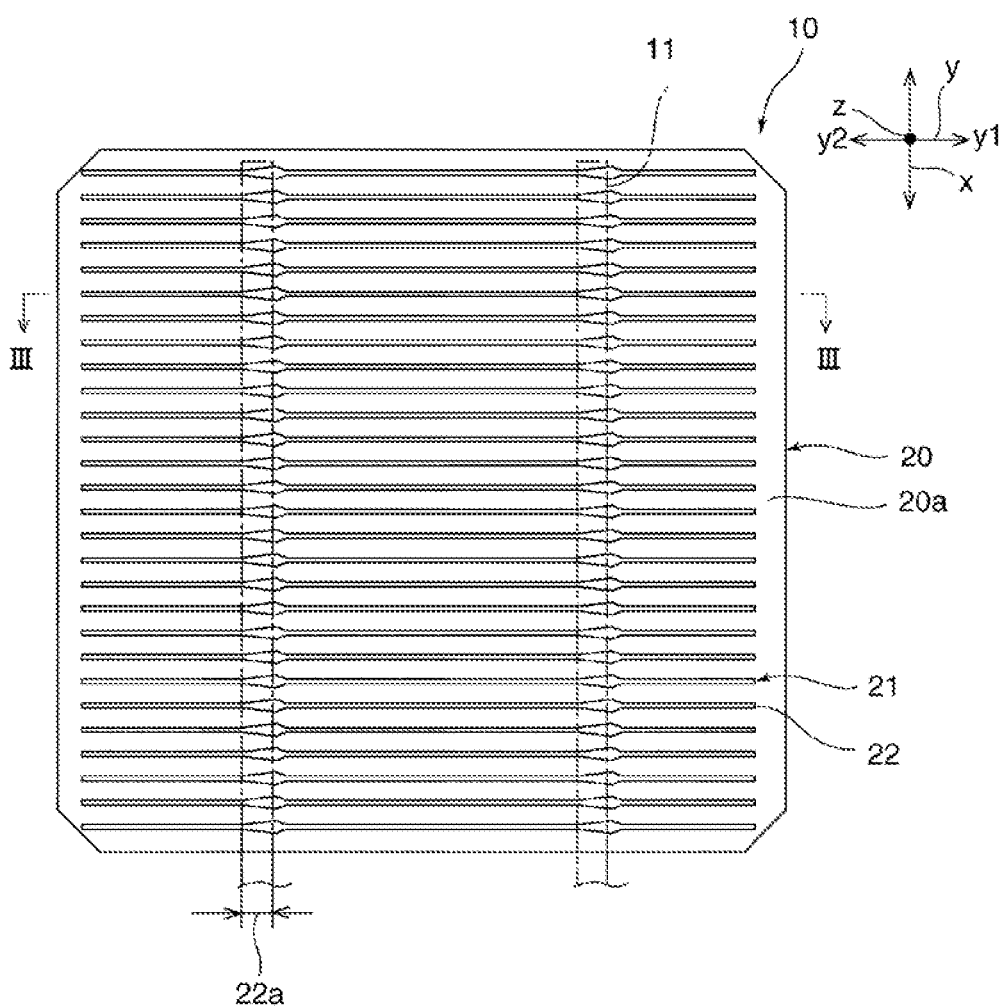
FIG. 2 is a schematic plan view of a solar cell according to the first embodiment viewed from a light-receiving surface side.
Figure 3:
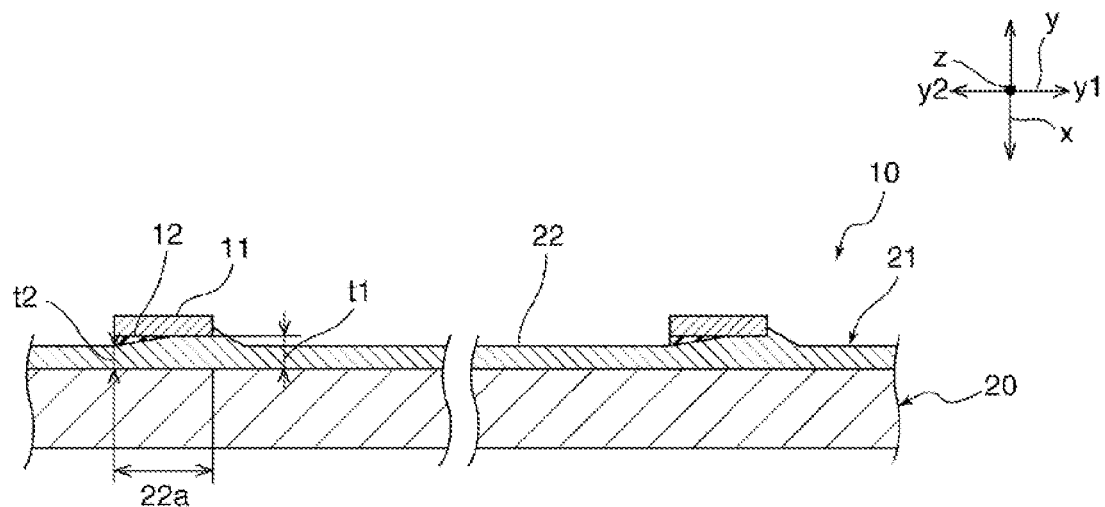
FIG. 3 is a schematic cross-sectional view taken along a line III-III in FIG. 2.

FIG. 2 is a schematic plan view of the solar cell viewed from the light-receiving surface side. FIG. 3 is a schematic cross-sectional view taken along a line III-III in FIG. 2. The configuration of solar cell 10 is described with reference to FIG. 2 and FIG. 3.

Solar cell 10 described herein is merely an example. In the invention, the type and the configuration of the solar cell are not particularly limited.

In this embodiment, one of the main surfaces of the solar cell 10 is the light-receiving surface and the other main surface is the back surface. Alternatively, both main surfaces of the solar cell may be the light-receiving surfaces. In such a case, each of first and second protecting materials 14 and 15 preferably has translucency.

(Photoelectric Conversion Body 20)

As shown in FIG. 2, solar cell 10 includes photoelectric conversion body 20 that generates carriers (electrons and holes) upon receiving light.

Photoelectric conversion body 20 includes a semiconductor material with a semiconductor junction such as HIT (registered trademark) junction, pn junction, or pin junction. For example, the semiconductor material includes a crystalline silicon semiconductor such as a single crystal silicon, a polycrystal silicon, or the like, an amorphous silicon semiconductor, and a compound semiconductor such as GaAs.

(Overview of Electrode 21)

Electrode 21 is formed on light-receiving surface 20$a$ of photoelectric conversion body 20. Although omitted in the drawing, similarly, electrode 21 is also formed on the back surface of photoelectric conversion body 20. As shown in FIG. 2, electrode 21 includes a plurality of finger electrodes 22. The detail of the configuration of electrode 21 is described after how solar cells 10 are electrically connected through wiring material 11 is described.

(Electrical Connection of Solar Cells 10 through Wiring Material 11)

As shown in FIG. 1, solar cells 10 adjacently arranged are electrically connected with each other through wiring material 11. Specifically, wiring material 11 has a thin and long shape. More specifically, in this embodiment, wiring material 11 has a linear shape. Wiring material 11 extends in arrangement direction x. One end of wiring material 11 is electrically connected to electrode 21 on the light-receiving surface 20$a$ side of solar cell 10, while the other end of wiring material 11 is electrically connected to electrode 21 on the back surface side of solar cell 10 adjacent to solar cell 10 mentioned above. Thus, solar cells 10 adjacently arranged are electrically connected through wiring material 11.

Wiring material 11 is not particularly limited as long as it is conductive. For example, wiring material 11 may include a wiring material main body and an envelope layer enveloping the wiring material main body. For example, the wiring material main body may be made of a metal material such as Cu. For example, the enveloping layer may be made of metal such as Ag or an alloy such as solder.

As shown in FIG. 1 and FIG. 3, wiring material 11 and solar cell 10 are bonded together by resin adhesive 12. Specifically, in this embodiment, wiring material 11 and solar cell 10 are bonded together by resin adhesive 12, while electrode 21 of solar cell 10 and wiring material 11 are in direct contact with each other. Thus, in this embodiment, electrode 21 and wiring material 11 are electrically connected by being in direct contact with each other. Thus, instead of a conductive resin, resin adhesive 12 may be made of an insulating resin such as epoxy resin, acryl resin, polyimide resin, phenol resin, urethane resin, silicone resin, or mixture or copolymer of these resins.

Resin adhesive 12 is preferably a curable resin such as a light curing resin, a thermosetting resin, or the like. If resin adhesive 12 is a thermosetting resin, the curing temperature is preferably 200° C. or lower.

In the embodiment, if the resin adhesive is conductive, the resin adhesive may be an anisotropic conductive resin adhesive in which conductive particles are dispersed in an insulating resin. In such a case, the electrode and the wiring material may not necessarily be in direct contact with each other. The electrode and the wiring material may be electrically connected with each other through the conductive particles.

With the anisotropic conductive resin adhesive being used as the resin adhesive, the contraction rate of the resin adhesive at the time of curing can be made small. Thus, residual stress of the resin adhesive can be made small.

If the resin adhesive is the anisotropic conductive resin adhesive, for example, the insulating resin may be epoxy resin, acryl resin, polyimide resin, phenol resin, urethane resin, silicone resin, or a mixture or copolymer of these resins. The conductive particles may be particles of a metal such as nickel, copper, silver, aluminum, tin, gold, or an alloy including one or more of these metals. Alternatively, the conductive particles may be insulating particles provided with a conductive coating such as metal coating or alloy coating.

(Detail of Electrode 21)

As shown in FIG. 2, finger electrodes 22 each extend in direction y orthogonal to arrangement direction x in which wiring material 11 extends to be parallel with each other. Finger electrodes 22 are arranged in parallel with each other along arrangement direction x. In the invention, "orthogonal" includes substantially orthogonal. Specifically, in the invention, it is regarded as being "orthogonal" as long as it is within the range of 90°±5°.

As shown in FIG. 3, the thickness of bonding area 22a of finger electrode 22 bonded to wiring material 11 decreases toward y2 side from y1 side in direction y in which finger electrode 22 extends. Specifically, the thickness of bonding area 22a of finger electrode 22 bonded to wiring material 11 gradually decreases substantially monotonously toward y2 side from y1 side. Thus, in this embodiment, a y1 side end portion of bonding area 22a of finger electrode 22 is in direct contact with wiring material 11. Meanwhile, in bonding area 22a, resin adhesive 12 is provided between a y2 side end portion of bonding area 22a and wiring material 11. The y2 side end portion of bonding area 22a is bonded to wiring material 11 by resin adhesive 12. Thus, in this embodiment, in bonding area 22a, the y1 side end portion is bonded to wiring material 11 with lower bonding strength than at least part of the other portion of bonding area 22a. Specifically, in bonding area 22a, the bonding strength of the y1 side end portion to wiring material 11 is lower than the bonding strength of the y2 side end portion of bonding area 22a to wiring material 11.

Maximum thickness t1 at the y1 side end portion of bonding area 22a of finger electrode 22 is larger than minimum thickness t2 at the y2 side end portion of bonding area 22a, but is preferably not larger than 2.5 times of minimum thickness t2, and is more preferably between 1.1 times and 2.0 times of minimum thickness t2, both inclusive.

As shown in FIG. 2, in this embodiment, the width of bonding area 22a of finger electrode 22 decreases toward y2 side from y1 side in direction y. Specifically, the width of bonding area 22a of finger electrode 22 decreases substantially monotonously toward y2 side from y1 side in direction y. The maximum width at the y1 side end portion of bonding area 22a is larger than the minimum width at the y2 side end portion of bonding area 22a, but is preferably not larger than 2.5 times of the minimum width, and is more preferably between 1.1 times and 2.0 times of the minimum width, both inclusive.

(Method for Producing Solar Cell Module 1)

Next, a method for manufacturing solar cell module 1 is described in detail.

First, photoelectric conversion body 20 is prepared. Photoelectric conversion body 20 can be produced by a known method.

Next, electrode 21 is formed on each of light-receiving surface 20a and the back surface of photoelectric conversion body 20, and thus solar cell 10 is completed. A method for forming electrode 21 is not particularly limited. Electrode 21 can be formed by printing a conductive paste by screen printing for example. Adhered portion 22a of which the width and the thickness change can be formed by using a screen printing plate having an opening of which the thickness increases toward y1 side, or by printing including plural printing steps.

Then, solar cells 10 prepared as described above are electrically connected with each other through wiring material 11. Specifically, wiring material 11 is disposed on solar cell 10 with resin adhesive 12 provided in between, and wiring material 11 is relatively pressed against the side of solar cell 10. Thus, wiring material 11 and solar cell 10 are bonded together. By repeating the bonding of solar cell 10 and wiring material 11, solar cells 10 are electrically connected with each other.

Next, sealing material 13 and first and second protecting materials 14 and 15 shown in FIG. 1 are prepared. For example, a resin sheet such as an EVA sheet is placed on second protecting material 15. Solar cells 10 electrically connected with each other through wiring material 11 are disposed on the resin sheet. A resin sheet such as an EVA sheet is placed on solar cells 10, and first protecting material 14 is placed on the resin sheet. These are tacked together by being pressed and heated in decompressed atmosphere, and then are heated again so that resin in the resin sheets is cross-linked, and thus sealing material 13 is formed. A embodiment of the solar cell module 1 can be produced through the above described steps.

A terminal box, a metal frame, and the like may be attached if needed.

Solar cell 10, photoelectric conversion body 20, and wiring material 11 have different thermal expansion rates. Thus, if a temperature of solar cell module 1 changes, wiring material 11 contracts or expands relative to photoelectric conversion body 20. Generally, wiring material 11 has a larger thermal-expansion rate than photoelectric conversion body 20. Thus, if the temperature of solar cell module 1 rises, wiring material 11 expands relative to photoelectric conversion body 20, and if the temperature of solar cell module 1 drops, wiring material 11 contracts relative to photoelectric conversion body 20. Thus, the temperature change of solar cell module 1 produces stress between wiring material 11 and photoelectric conversion body 20.

For example, if the bonding area of the finger electrode for the wiring material is flat, the entire bonding area needs to be in contact with the wiring material to electrically connect the finger electrode and the wiring material with each other. Thus, in such a case, only a side wall of the finger electrode and the wiring material are bonded together by the resin adhesive, and the top surface of the finger electrode and the wiring material are actually not bonded together. Thus, bonding strength between the finger electrode and the wiring material is low. Similarly, even when the anisotropic conductive resin adhesive is used for the adhesion between the wiring material and the finger electrode, the bonding strength between the finger electrode and the wiring material is low because a sufficient amount of resin is not provided between the wiring material and the top surface of the finger electrode. Thus, when a temperature of the solar cell module changes and stress is applied between the wiring material and the photoelectric conversion body, the wiring material is likely to detach.

On the other hand, conductivity is achieved through direct contact between a portion of bonding area 22a on y1 side in direction y and wiring material 11, and a portion of bonding area 22a on y2 side in direction y is bonded to wiring material 11 by resin adhesive 12. Thus, in this embodiment, the bonding strength between wiring material 11 and finger electrode 22 is high.

Moreover, since the bonding strength between the y1 side end portion of bonding area 22a and wiring portion 11 is low, when a large stress is applied to wiring material 11, the y1 side end portion of bonding area 22a and wiring portion 11 between which the bonding strength is low detach from each other. Thus, the stress applied to wiring material 11 is released. Accordingly, wiring material 11 can be effectively prevented from completely detaching. Thus, solar cell module 1 of this embodiment has high thermal shock resistance.

In this embodiment, the y1 side end portion of bonding area 22a electrically connected with wiring material 11 is wider than the y2 side end portion. Thus, contact resistance between wiring material 11 and finger electrode 22 can be made low, and thus output of solar cell module 1 can be increased.

Since the y2 side end portion of the bonding area 22a is thin, a larger amount of resin adhesive 12 is provided between the y2 side end portion of bonding area 22a and wiring material 11. Thus, the bonding strength between wiring material 11 and finger electrode 22 can be further increased.

Other preferred embodiments of this embodiment are described below. In the description given below, the same reference signs denote materials having functions substantially the same as those in the first embodiment and description of the materials is omitted.

Second Embodiment

Figure 4:
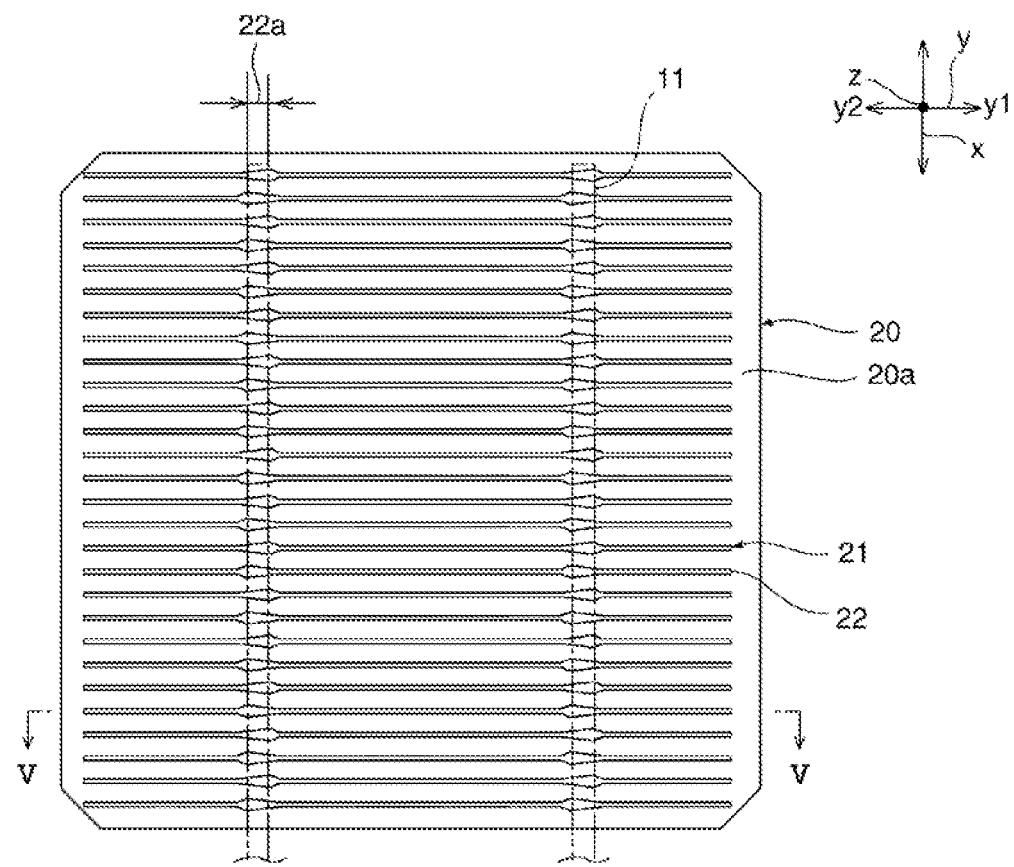
FIG. 4 is a schematic plan view of a solar cell according to a second embodiment viewed from the light-receiving surface side.
Figure 5:
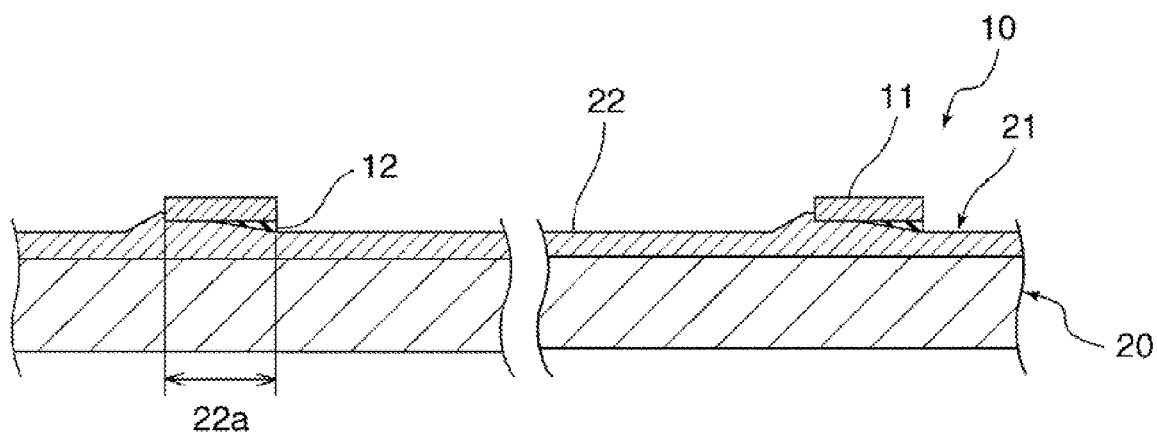
FIG. 5 is a schematic cross-sectional view taken along a line V-V in FIG. 4.

FIG. 4 is a schematic plan view of a solar cell according to a second embodiment viewed in the light-receiving surface side. FIG. 5 is a schematic cross-sectional view taken along a line V-V in FIG. 4.

In the first embodiment, the case is described in which the y1 side end portion of bonding area 22a of each of finger electrodes 22 is thicker than the y2 side end portion. However, the invention is not limited to this configuration.

For example, as shown in FIG. 4, the thick portion of bonding area 22a may differ among finger electrodes 22. In this embodiment, specifically, as shown in FIG. 4 and FIG. 5, finger electrode 22 having bonding area 22a in which thick and wide portion is positioned on y1 side and finger electrode 22 having bonding area 22a in which thick and wide portion is positioned on y2 side are alternately arranged along arrangement direction x. Even in this case, substantially the same effect as that in the first embodiment can be obtained.

Third Embodiment

Figure 6:
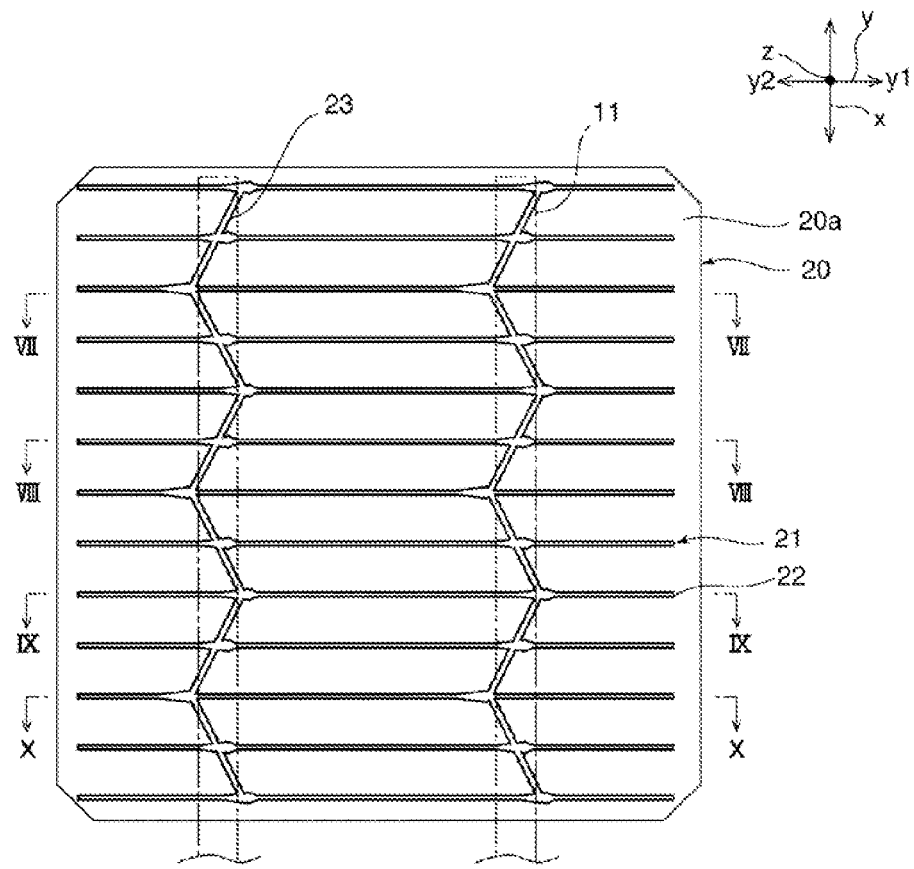
FIG. 6 is a schematic plan view of a solar cell according to a third embodiment viewed from the light-receiving surface side.
Figure 7:
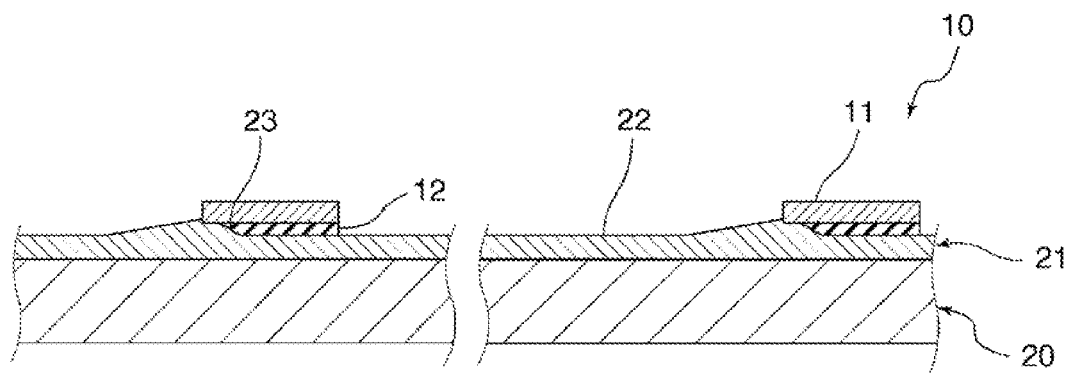
FIG. 7 is a schematic cross-sectional view taken along a line VII-VII in FIG. 6.
Figure 8:
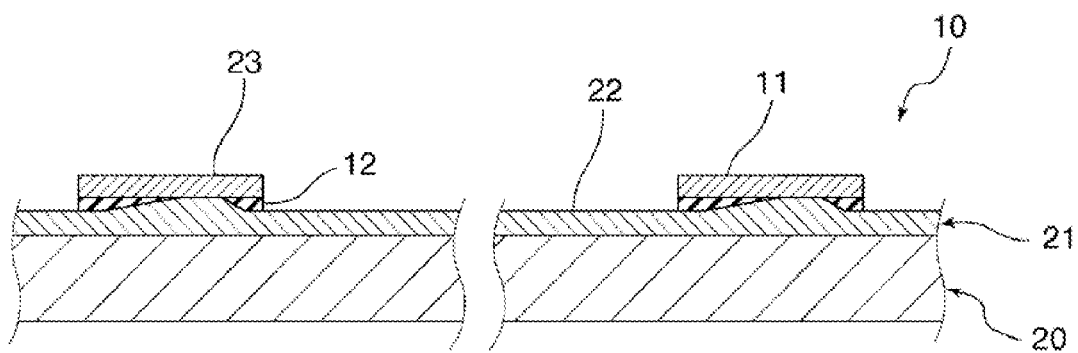
FIG. 8 is a schematic cross-sectional view taken along a line VIII-VIII in FIG. 6.
Figure 9:
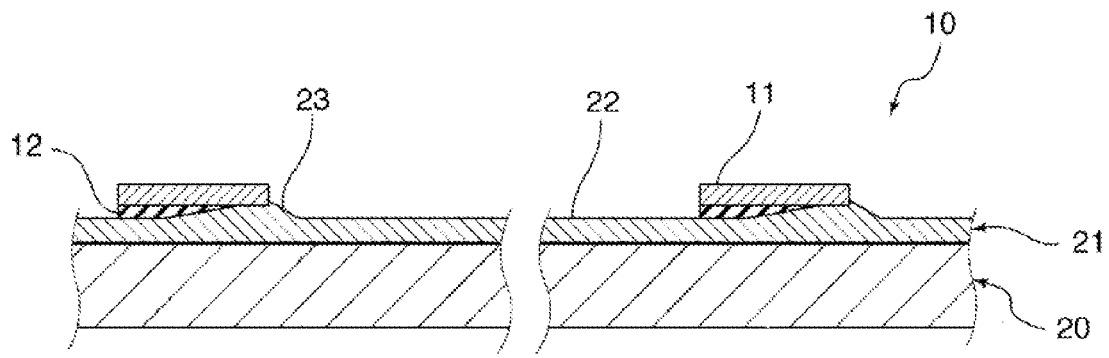
FIG. 9 is a schematic cross-sectional view taken along a line IX-IX in FIG. 6.
Figure 10:
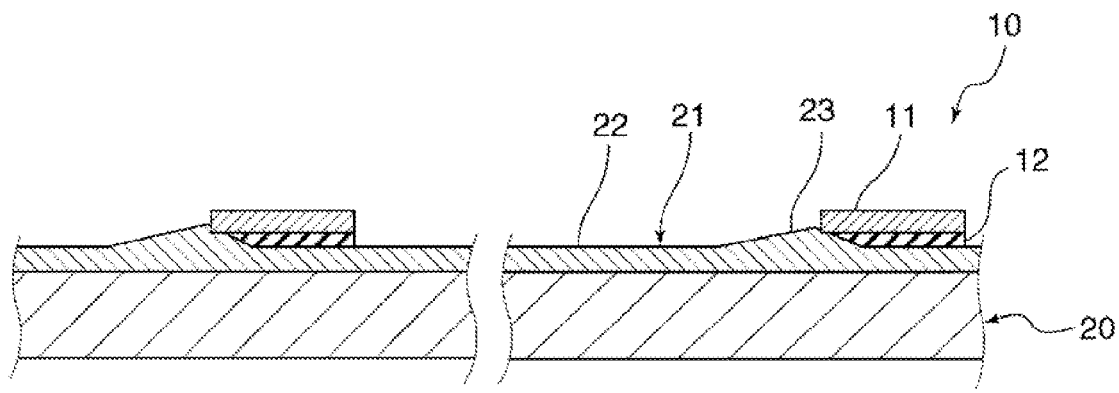
FIG. 10 is a schematic cross-sectional view taken along a line X-X in FIG. 6.

FIG. 6 is a schematic plan view of a solar cell according to a third embodiment viewed from the light-receiving surface side. FIG. 7 is a schematic cross-sectional view taken along a line VII-VII in FIG. 6. FIG. 8 is a schematic cross-sectional view taken along a line VIII-VIII in FIG. 6. FIG. 9 is a schematic cross-sectional view taken along a line IX-IX in FIG. 6. FIG. 10 is a schematic cross-sectional view taken along a line X-X in FIG. 6.

In the first and the second embodiments, the case where electrode 21 includes finger electrodes 22 is described. However, the invention is not limited to such a configuration. For example, as shown in FIG. 6, electrode 21 may include finger electrodes 22 and bus bars 23. In such a case, bus bar 23 may cross the thickest portion of each finger electrode 22.

In this embodiment, as shown in FIG. 6 to FIG. 10, the thickness of finger electrode 22 changes at portions on both sides of bus bar 23 in y direction. Specifically, the thickness is largest at the intersecting portion between finger electrode 22 and bus bar 23 and decreases as it gets farther from the bus bar 23. Thus, in some of finger electrodes 22, in bonding area 22a, the y1 side end portion in the y direction is bonded to wiring material 11 with lower bonding strength than at least part of the other portion of bonding area 22a.

In the embodiment, in a case where a plurality of finger electrodes 22 are provided, not all finger electrodes 22 need to be bonded to wiring material 11 in such a way that the bonding strength of the y1 side end portion of bonding area 22a in the y direction to wiring material 11 is lower than the bonding strength of at least part of the other portion of bonding area 22a to wiring material 11 as in the first and the second embodiments. It is sufficient to bond at least one of finger electrodes 22 in such a way that the bonding strength of the y1 side end portion of bonding area 22a in the y direction to wiring material 11 is lower than the bonding strength of at least part of the other portion of bonding area 22a to wiring material 11, as in this embodiment. Even in such a case, because bonding area 22a has a portion with low bonding strength, the stress releasing effect described in the first embodiment can be obtained.

The invention is described further in detail on the basis of specific examples. It should be noted that the invention is not particularly limited to the examples given below, and can be modified as needed without changing the gist of the invention to be implemented.

EXAMPLE 1

In Example 1, a solar cell module having a configuration similar to that of the solar cell module according to the third embodiment described above is produced in a manner described below.

First, a silver paste printing is performed by screen printing an epoxy thermosetting resin silver paste on a light-receiving surface of a photoelectric conversion body. The paste is pre-cured by heating at 150° C. for 5 hours, and thus electrodes on the light-receiving surface side are formed. Then, a silver paste printing is performed by screen printing an epoxy thermosetting resin silver paste on a back surface of the photoelectric conversion body. The paste is pre-cured by heating at 200° C. for 1 hour, and thus electrodes on a back surface side are formed.

On the light-receiving surface, the electrodes each have the width of about 100 μm, and are arranged at a pith of 2 mm. On the back surface, the electrodes each have the width of about 100 μm, and are arranged at a pith of 1 mm. In the bonding area 22a, the maximum thickness on y1 side is about 50 μm and the minimum thickness on y2 side is about 30 μm. In the bonding area 22a, the maximum width on y1 side is about 150 μm and the minimum width on y2 side is about 90 μm.

Next, with a dispenser, a portion to which a wiring material is to be attached is coated by epoxy resin (resin adhesive) including about 5% by volume of nickel particles to form a layer having a thickness of about 30 μm. Next, the wiring material is disposed on the coated resin adhesive and only the bonding area is heated at 200° C. for 1 hour under pressure of about 2 MPa, and thus the resin adhesive is cured. Finally, first and second protecting materials 14 and 15, as well as sealing material 13 are provided and thus, the solar cell module according to the first embodiment is produced.

COMPARATIVE EXAMPLE 1

A solar cell module is produced in a manner similar to that in Example 1 except for that finger electrode 22 has substantially the same thickness and width.

Temperature cycle test is performed on a thousand sheets of the solar cell module produced as in Example 1 and a thousand sheets of the solar cell module produced as in Comparative Example 1 through a method similar to that defined in JIS C8917 except for that the cycle number is three times as large as that defined. Similarly, damp heat test is performed through a method defined in JIS C8917 except for that the cycle number is three times as large as that defined. The result is shown in Table 1 below.

TABLE 1

| | Temperature cycle test | Damp heat test |
|---|---|---|
| Example 1 | −3.8% | −4.6% |
| Comparative Example 1 | −4.2% | −5.0% |

As shown in Table 1, higher heat resistance and moisture resistance are obtained in Example where the thickness of finger electrode 22 changes compared with Comparative Example where the thickness does not change.

In this way, the embodiments improve the thermal shock resistance of a solar cell module in which solar cells and a wiring material are bonded together using a resin adhesive.

What is claimed is:

1. A solar cell module, comprising:
   solar cells arranged in a first direction x, each including a photoelectric conversion body;
   an electrode provided on a surface of the photoelectric conversion body;
   a wiring material that extends along direction x and electrically connects the solar cells with each other; and
   a resin adhesive that bonds the solar cells and the wiring material together, wherein
   the electrode includes a finger electrode extending in a second direction y orthogonal to direction x having a vertical thickness that varies in direction y,
   wherein the finger electrode crosses the wiring material to form an area of overlap and wherein the area of overlap has a left lateral side and a right lateral side both extending in direction x with resin adhesive between at least part of the finger electrode and the wiring material to form a bond therebetween, and wherein the left lateral side has a different bonding strength than the right lateral side.

2. The solar cell module according to claim 1, wherein a thickness of the resin adhesive within the area of overlap between the finger electrode and the wiring material gradually decreases from the left lateral side to the right lateral side.

3. The solar cell module according to claim 1, wherein the finger electrode directly contacts the wiring material at one of the lateral sides within the area of overlap, and wherein the one of the lateral sides within the area of overlap has a minimum thickness of the resin adhesive.

4. The solar cell module according to claim 2, wherein a maximum thickness of the resin adhesive within the area of overlap at the left lateral side is between 1.1 times and 2.0 times a minimum thickness at the right lateral side.

5. A solar cell module, comprising:
   solar cells arranged in a first direction x, each including a photoelectric conversion body;
   an electrode provided on a surface of the photoelectric conversion body;
   a wiring material that extends along direction x and electrically connects the solar cells with each other; and
   a resin adhesive that bonds the solar cells and the wiring material together, wherein
   the electrode includes a finger electrode extending in a second direction y orthogonal to direction x,
   wherein the finger electrode crosses the wiring material to form an area of overlap, and wherein the area of overlap has a leftmost lateral side and a rightmost lateral side both extending in direction x with resin adhesive between at least part of the finger electrode and the wiring material to form a bond therebetween, and wherein the leftmost lateral side has a different bonding strength than the rightmost lateral side and a thickness of the resin adhesive extending in the direction y within the area of overlap between the finger electrode and the wiring material gradually decreases from the leftmost lateral side to the rightmost lateral side.

6. The solar cell module according to claim 5, wherein the finger electrode directly contacts the wiring material at one of the lateral sides within the area of overlap, and wherein the one of the lateral sides within the area of overlap has a minimum bonding thickness of the resin adhesive.

7. The solar cell module according to claim 5, wherein a maximum thickness of the resin adhesive within the area of overlap at the leftmost lateral side is between 1.1 times and 2.0 times a minimum thickness at the rightmost lateral side.

* * * * *